(12) United States Patent
Franken et al.

(10) Patent No.: US 10,665,419 B2
(45) Date of Patent: May 26, 2020

(54) INTELLIGENT PRE-SCAN IN SCANNING TRANSMISSION CHARGED PARTICLE MICROSCOPY

(71) Applicant: FEI Company, Hillsboro, OR (US)

(72) Inventors: Erik Michiel Franken, Nuenen (NL); Ivan Lazic, Eindhoven (NL); Bart Jozef Janssen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/282,021

(22) Filed: Feb. 21, 2019

(65) Prior Publication Data

US 2019/0295814 A1  Sep. 26, 2019

(30) Foreign Application Priority Data

Feb. 22, 2018  (EP) .................................. 18158110

(51) Int. Cl.
*H01J 37/22* (2006.01)
*H01J 37/244* (2006.01)
(Continued)

(52) U.S. Cl.
CPC .......... *H01J 37/222* (2013.01); *H01J 37/244* (2013.01); *H01J 37/28* (2013.01); *H01J 37/302* (2013.01);
(Continued)

(58) Field of Classification Search
CPC ........ H01J 37/222; H01J 37/244; H01J 37/28; H01J 37/295; H01J 37/2955; H01J 2237/2802; H01J 2237/2803
See application file for complete search history.

(56) References Cited

U.S. PATENT DOCUMENTS 8,170,832 B2   5/2012  Young et al.
8,866,078 B2 * 10/2014  Akima ................. H01J 37/153
                                                             250/306
(Continued)

FOREIGN PATENT DOCUMENTS

EP   1437759 A2   7/2004
EP   2194565 A1   6/2010

*Primary Examiner* — David E Smith

(57) ABSTRACT

A method of imaging a specimen in a Scanning Transmission Charged Particle Microscope, comprising the following steps:
  Providing the specimen on a specimen holder;
  Providing a beam of charged particles that is directed from a source through an illuminator so as to irradiate the specimen;
  Providing a segmented detector for detecting a flux of charged particles traversing the specimen;
  Causing said beam to scan across a surface of the specimen, and combining signals from different segments of the detector so as to produce a vector output from the detector at each scan position, said vector output having components Dx, Dy along respective X, Y coordinate axes,
specifically comprising:
  Performing a relatively coarse pre-scan of the specimen, along a pre-scan trajectory;
  At selected positions $p_i$ on said pre-scan trajectory, analyzing said components Dx, Dy and also a scalar intensity sensor value Ds;
  Using said analysis of Dx, Dy and Ds to classify a specimen composition at each position $p_i$ into one of a group of composition classes;
  For a selected composition class, performing a relatively fine scan at positions $p_i$ assigned to that class.

12 Claims, 6 Drawing Sheets

(51) Int. Cl.
*H01J 37/28* (2006.01)
*H01J 37/304* (2006.01)
*H01J 37/302* (2006.01)

(52) U.S. Cl.
CPC ... *H01J 37/304* (2013.01); *H01J 2237/24465* (2013.01); *H01J 2237/24495* (2013.01); *H01J 2237/2802* (2013.01); *H01J 2237/2804* (2013.01)

(56) References Cited

U.S. PATENT DOCUMENTS

| | | | |
|---|---|---|---|
| 9,312,098 B2 * | 4/2016 | Lazic | H01J 37/244 |
| 9,564,291 B1 | 2/2017 | Own et al. | |
| 10,403,469 B2 * | 9/2019 | Lazic | H01J 37/28 |
| 2014/0070099 A1 * | 3/2014 | Aliman | H01J 37/26 250/307 |

* cited by examiner

INTELLIGENT PRE-SCAN IN SCANNING TRANSMISSION CHARGED PARTICLE MICROSCOPY

The invention relates to a method of imaging a specimen in a Scanning Transmission Charged Particle Microscope, comprising the following steps:
  Providing the specimen on a specimen holder;
  Providing a beam of charged particles that is directed from a source through an illuminator so as to irradiate the specimen;
  Providing a segmented detector for detecting a flux of charged particles traversing the specimen;
  Causing said beam to scan across a surface of the specimen, and combining signals from different segments of the detector so as to produce a vector output from the detector at each scan position, said vector output having components Dx, Dy along respective coordinate axes X, Y.

The invention also relates to a Scanning Transmission Charged Particle Microscope (STCPM) in which such a method can be performed.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In general, a Charged Particle Microscope (CPM) will comprise at least the following components:
  A particle source, such as a W or $LaB_6$ source, Schottky gun or Cold Field Emission Gun (CFEG) in the case of electrons, or a Liquid Metal Ion Source (LMIS) or Nano-Aperture Ion Source (NAIS) in the case of ions, for instance.
  An illuminator (illumination system; illuminating particle-optical column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
  A specimen holder, on which a specimen under investigation can be held and positioned (e.g. tilted, rotated). If desired, this holder can be moved so as to effect scanning motion of the specimen with respect to the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.
  A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations. In the context of the present invention, the employed detector will be segmented, e.g. as in the case of a quadrant detector, pixelated detector (camera sensor), Position Sensitive Detector (PSD), etc.
A Transmission Charged Particle Microscope (TCPM; such as a TEM, for example), will specifically comprise:
  An imaging system (imaging particle-optical column), which essentially takes charged particles that are transmitted through a specimen and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A method as set forth in the opening paragraph above is exploited in so-called Integrated Vector Field (iVF) imaging, which is described in U.S. Pat. No. 9,312,098 and US 2016/307729 A1, both of which have an inventor in common with the present invention and are incorporated herein by reference. In iVF imaging, said vector output from the detector at each scan position is assembled into a vector field, which is then subjected to a mathematical integration operation that produces an iVF image (which represents a map of electrostatic potential in the specimen). The Dx, Dy vector components referred to above can be used to create so-called "gradient images", in which pointwise vector component values are used to represent intensity/greyscale.

Of importance in the context of the present invention is the concept of vitrification, i.e. the rapid cooling of an aqueous specimen to cryogenic temperatures so as to freeze the (water in the) specimen into amorphous ice rather than crystalline ice. This procedure is, for example, elucidated in more detail in U.S. Pat. Nos. 9,116,091, 9,772,265 and 9,865,428, all of which are assigned to the assignee of the present invention and are incorporated herein by reference. Vitrification of thin specimens (e.g. for study in a TEM) tends to be a rather complicated and delicate procedure, with a relatively high fail rate: in general, a relatively large area of a given specimen can be sub-optimal as regards one or more of:

The presence of areas of crystalline rather than amorphous ice;

The presence of unwanted contaminants in/on amorphous ice.

Moreover, the actual bodies of interest (e.g. suspended biological proteins/viruses/cells/organisms) in a vitrified aqueous solution tend to be relatively small islands in a relatively large sea of surrounding ice, and the ice itself also generally forms comparatively small pockets in a much larger surrounding support structure (e.g. a porous carbon film spanned on a supporting metallic grid). Looking for a particular body of interest in a vitrified specimen can therefore be somewhat akin to looking for a proverbial "needle in a haystack".

It is an object of the invention to produce an innovative imaging technique, utilizing mechanisms underlying iVF imaging. More specifically, it is an object of the invention that this imaging technique should be usable to improve the efficiency with which multifarious specimens can be imaged, such as vitrified specimens, negatively-stained specimens, etc. It is a particular object of the invention that it should lend itself to so-called "Single Particle Analysis" (SPA).

These and other objects are achieved in a method as set forth in the opening paragraph above, characterized by:

Performing a relatively coarse pre-scan of the specimen, along a pre-scan trajectory;

At selected positions $p_i$ on said pre-scan trajectory, analyzing said components Dx, Dy and also a scalar intensity sensor value Ds;

Using said analysis of Dx, Dy and Ds to classify a specimen composition at each position $p_i$ into one of a group of composition classes;

For a selected composition class, performing a relatively fine scan at positions $p_i$ assigned to that class.

It should be noted that the phrases "relatively coarse" and "relatively fine" are mutually referent: given any two scans of mutually differing coarseness, the coarser of the two will be "relatively coarse" and the less coarse of the two will be "relatively fine" relative to one another. As here employed, the term "scalar" should be interpreted as referring to a value with just one component (amplitude), without regard for directionality; this contrasts to a vector signal (such as Dx, Dy), in which directionality plays a role. The scalar intensity sensor value Ds is associated with/derived from the post-specimen beam (see below). As will be discussed in more detail below, the invention is particularly useful in that it can be used to efficiently identify "fruitful" areas of a vitrified specimen during a relatively quick pre-scan, thus helping the microscope user to optimize throughput by avoiding unnecessary wastage of time on "unfruitful" areas of the specimen. More generally, the invention is innovative in that it facilitates a relatively rapid pre-classification of different regions in an inhomogeneous/multifarious specimen, allowing relatively easy identification of a "region of interest" to be examined in a follow-up fine scan. In principle, this applies to various types of specimens, e.g. biological, semiconductor, geological/petrological and/or metallurgical specimens.

To aid in understanding the invention, one can regard the abovementioned Dx, Dy signals as providing phase-related information pertaining to a given scan position $p_i$ on the specimen, and the Ds signal as providing amplitude-related information at that position. Different (types of) materials can exhibit very different behaviors as regards this phase/amplitude information, which can thus be used as a basis to divide a given specimen constitution into different composition classes. For example:

The Dx, Dy signals from amorphous ice will tend to be characteristically different to those from crystalline ice;

The Dx, Dy signals from amorphous carbon will tend to be characteristically different to those from amorphous ice;

The Ds signal from ice will tend to be characteristically different to that from copper, and so forth. See FIG. 5, for example.

There are different ways in which Dx, Dy signals as referred to above can be generated. For example, in a particular embodiment of the invention:

The employed detector is embodied to comprise four quadrants;

Said components Dx, Dy are compiled by calculating difference signals ("weighted signals") between complementary pairs of quadrants respectively arranged along X and Y directions.

A detector of this type is often referred to as a "quad detector" or "quad cell". If a transmitted beam "footprint" falls asymmetrically on a complementary pair of quadrants (e.g. arranged in +Y and −Y relative orientation), then a greater intensity "weight" can be assigned to one quadrant relative to the other, which will manifest itself in a differential signal output (e.g. voltage or current) from the pair of quadrants in question. Such a detector configuration is relatively straightforward.

In an alternative embodiment of the invention:

The employed detector is embodied as a pixelated detector comprising an array of pixels;

Said components Dx, Dy are compiled by:

Comparing pixel values to determine a location for a barycenter of said flux on the detector;

Expressing X and Y coordinate positions of said barycenter on the detector.

Because individual pixels in a pixelated detector are relatively small, and are generally present in relatively large numbers (e.g. in a 2048×2048 array), such an embodiment allows relatively high resolution as regards its ability to identify the intensity barycenter of the beam footprint incident thereon (e.g. using (proprietary) image analysis software). In this respect, it can be regarded as a somewhat more "sophisticated" embodiment than that in the previous embodiment, though there are situations in which the relatively rudimentary approach in the previous embodiment will suffice.

As regards the scalar Ds signal, this can also be generated in different ways. For example, in a given embodiment of the invention, Ds is a Bright Field (BF) value compiled by summing outputs from various segments of the employed segmented detector; more specifically, it is a weighted sum of the output signals from all segments of the detector, whereby the weight for a given segment is the intensity registered by that segment. In this way, the beam footprint on the detector is essentially treated as a bright field disk.

In an alternative (or supplementary) embodiment of the invention, said value Ds is an Annular Dark Field (ADF) value produced by an annular dark field sensor used in conjunction with said segmented detector (e.g. located upstream thereof, or outside an external perimeter thereof). ADF detectors are useful in that they catch high-scattering-angle transmitted beam particles (e.g. associated with relatively massive elements) that tend to fall outside the perimeter of conventional BF detectors; for example, they are sensitive to the presence of gold marker globules and/or high-Z contaminants such as lead, for instance (Z=atomic number). As here employed, the concept of ADF should be interpreted as encompassing so-called HAADF (High-Angle ADF). If desired, one may use both BF and ADF detectors to yield Ds signals.

Note that the Dx, Dy signals accrued during the relatively coarse pre-scan and/or the relatively fine follow-up scan can be used to generate iVF imagery. In that case:
  Said vector output per scan position is compiled to yield a vector field;
  Said vector field is mathematically processed by subjecting it to a two-dimensional integration operation, thereby producing an integrated vector field image of the specimen. This procedure is set forth in more detail in the above-mentioned U.S. Pat. No. 9,312,098 and US 2016/307729 A1, for example.

The invention can be efficiently executed if prior experience is used to "train" a controller (and/or microscope user) to perform the material classification step. More specifically:
  In at least one prior calibration session, a library is compiled of Dx, Dy and Ds values corresponding to various composition classes;
  Said classification step is performed by an algorithm that uses said library to elect a best-match composition class for the specimen at each said position $p_i$.

The acquired library can be manually "tuned" by a microscope user, if required. Also, the library can be periodically/continually updated with results from fresh calibration sessions, if desired. The actual best-match election may, if necessary, be determined using interpolation/extrapolation of results in the library, and may generally use a convergence criterium. For good order, the term "calibration" as here employed refers to any previous measurement results in which a material classification is matched to a given set of signals Dx, Dy, Ds.

As a general remark, it should be noted that that the symbols "X" and "Y" as referred to above are intended to refer to complementary coordinates of a (general) two-dimensional coordinate system. Such a system may be Cartesian (in which case "X" and "Y" have their ordinary graphical meanings, referring to orthogonal linear dimensions), but it could also be Polar, for example (in which case "X"/"Y" can be regarded as "placeholder" symbols for R/θ (radius/angle)).

The skilled artisan will also understand that the present invention is not limited to the performance of just two scans; if desired, more than two scans can be performed, as long as there is a relative difference in coarseness between at least two of the scans.

The invention will now be elucidated in more detail on the basis of exemplary embodiments and the accompanying schematic drawings, in which:

FIG. 1 renders a longitudinal cross-sectional view of an embodiment of an STCPM in which the present invention is implemented.

Figure 3:
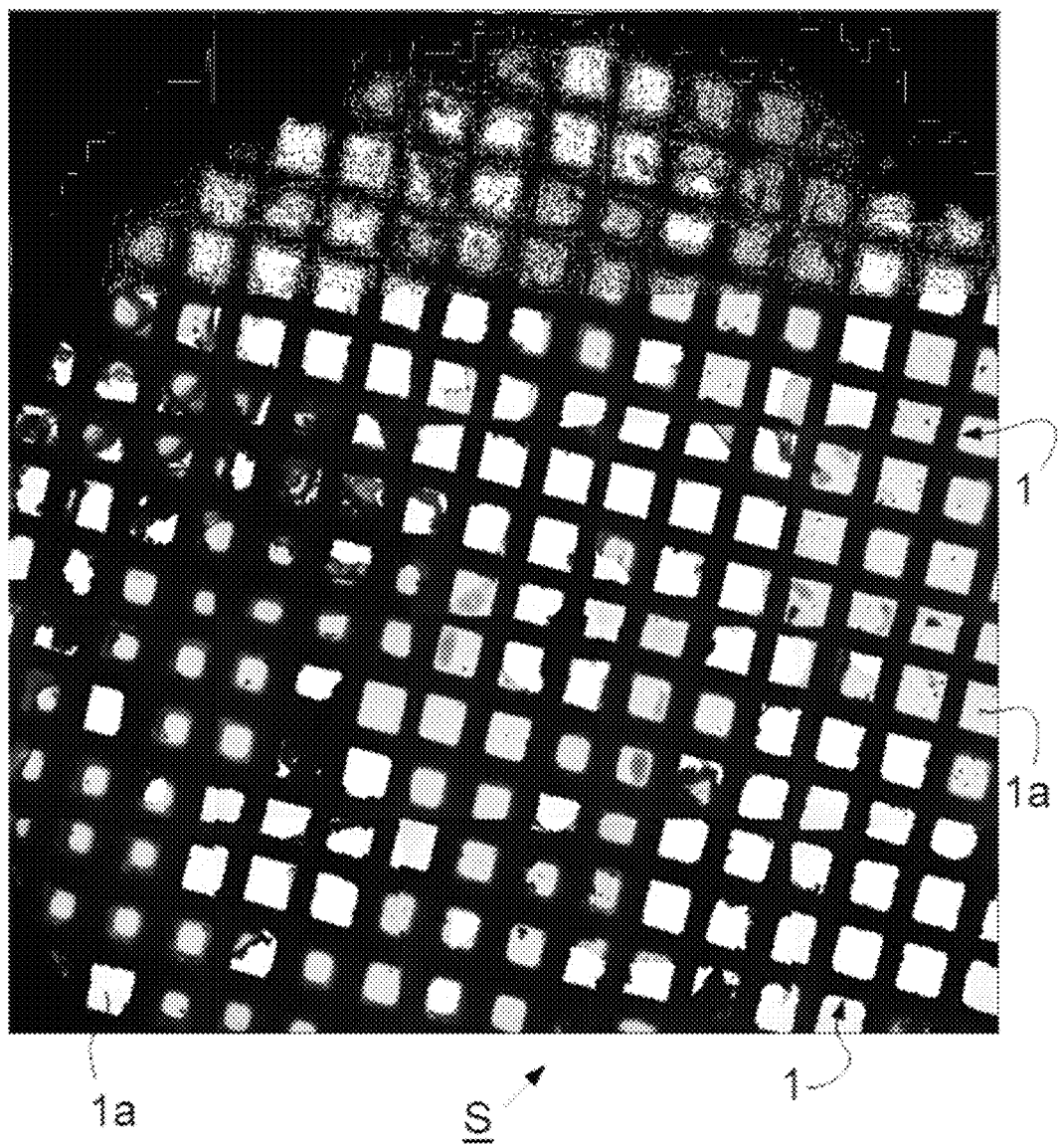
FIG. 3 shows a magnified photographic plan view of part of a vitrified specimen.
Figure 4:
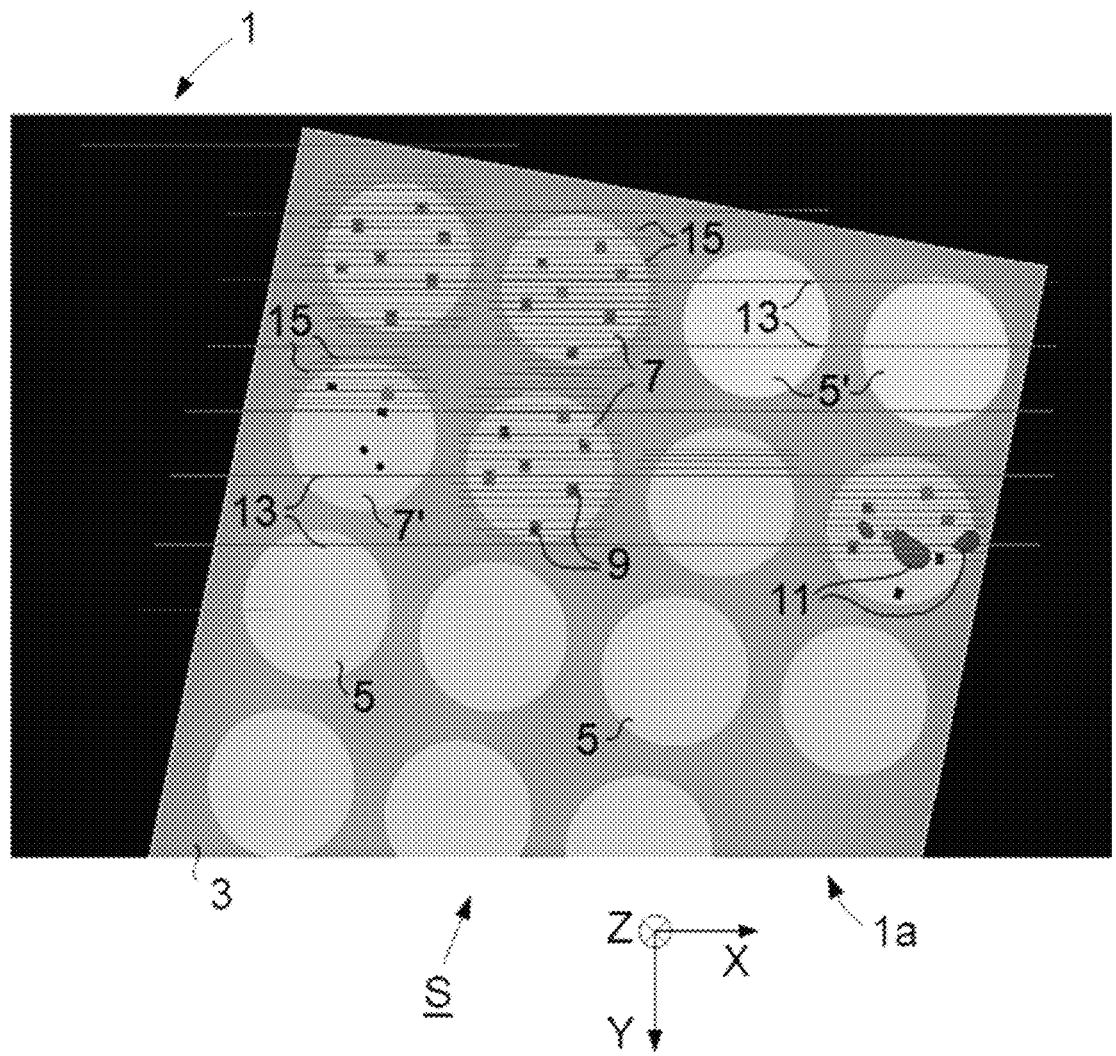

FIG. 4 schematically renders a close-up view of part of the subject of FIG. 3, and illustrates various aspects of an embodiment of the present invention.

Figure 5:
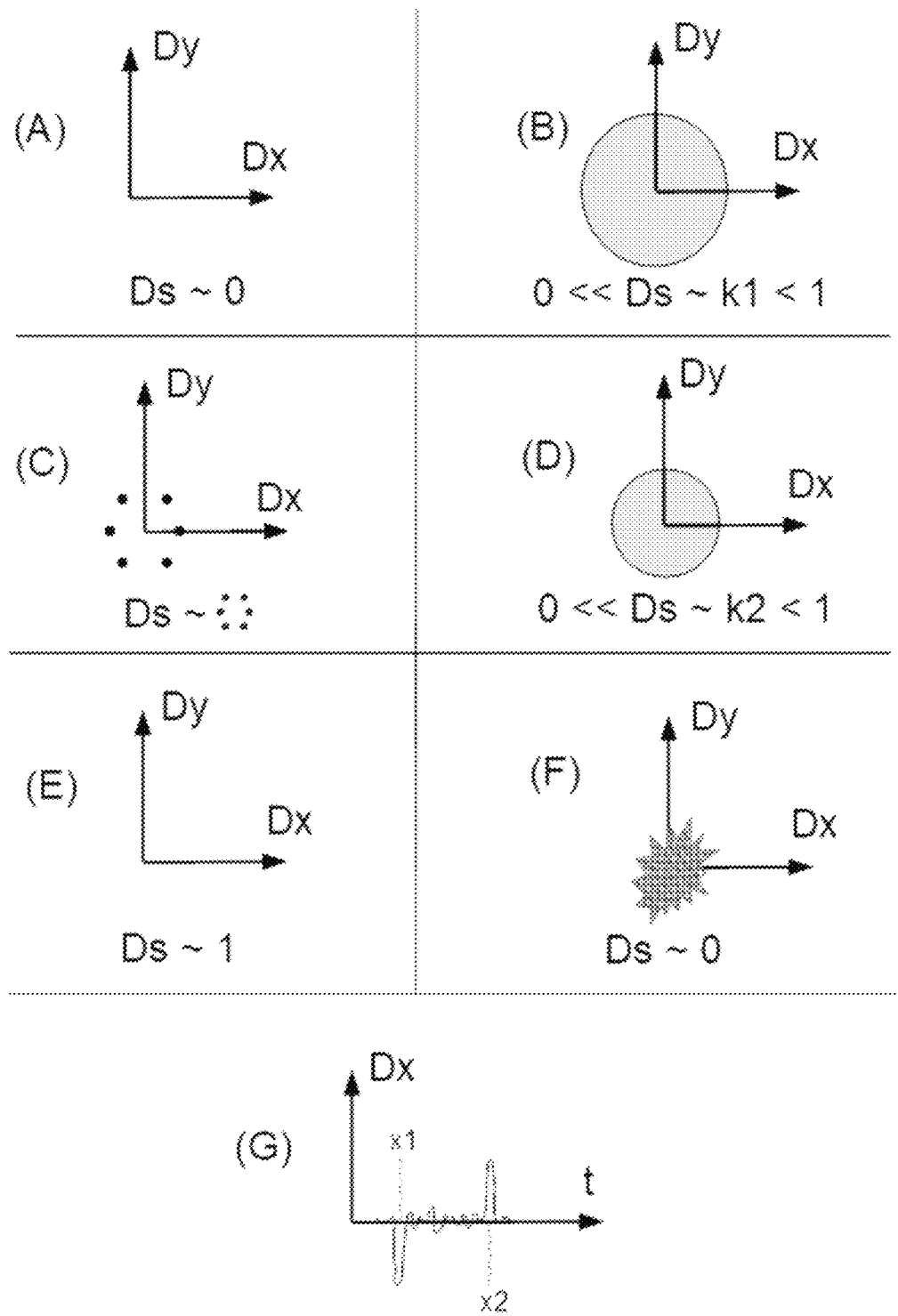

FIG. 5 is a schematic depiction of typical behavior of Dx, Dy and Ds considered at a selection of different points on the specimen depicted in FIG. 4.

In the Figures, where pertinent, corresponding parts may be indicated using corresponding reference symbols.

EMBODIMENT 1

Figure 1:
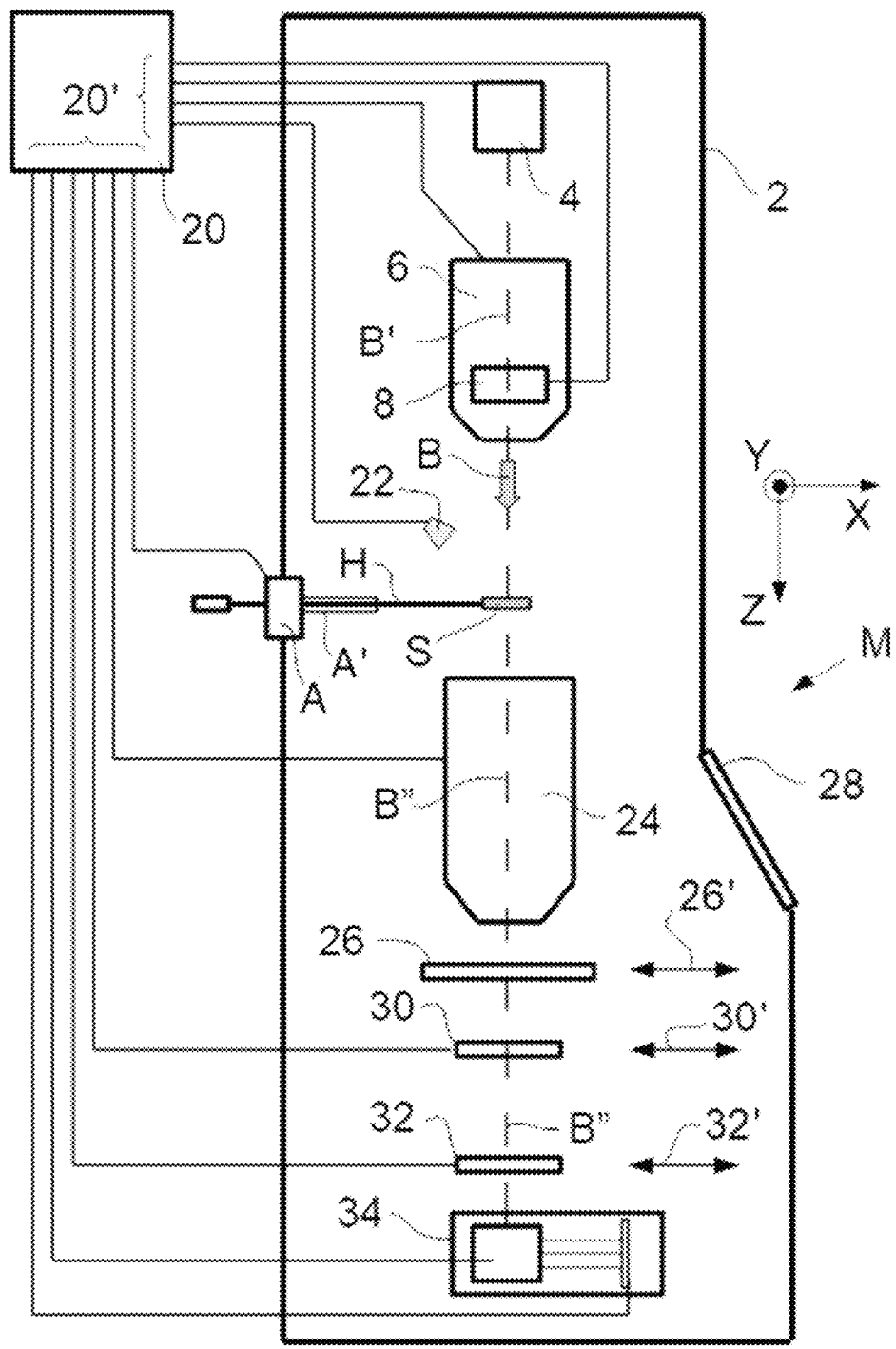

FIG. 1 (not to scale) is a highly schematic depiction of an embodiment of a Scanning Transmission Charged Particle Microscope (STCPM) M in which the present invention is implemented; more specifically, it shows a STEM (though, in the context of the current invention, it could just as validly be an ion-based microscope, for example). In the Figure, within a vacuum enclosure 2, an electron source 4 produces a beam B of electrons that propagates along an electron-optical axis B" and traverses an electron-optical illuminator 6, serving to direct/focus the electrons onto a chosen part of a specimen S (which may, for example, be (locally) thinned/planarized). Also depicted is a deflector system 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted coordinate system; typically, motion parallel to Z and tilt about X/Y will also be possible). Such movement allows different parts of the specimen S to be illuminated/imaged/inspected by the electron beam B traveling along axis B" (in the Z direction)—and/or allows scanning motion to be performed, as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of an analysis device 22, which might be a combined scintillator/photomultiplier or EDX (Energy-Dispersive X-Ray Spectroscopy) module, for instance; in such a case, an image could be constructed using basically the same principle as in a SEM. However, alternatively/supplementally, one can study electrons that traverse (pass through) the specimen S, exit/emanate from it and continue to propagate (substantially, though generally with some deflection/scattering) along axis B". Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B". An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of detector/analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B".

STEM camera/detector 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B" (although such retraction would not be a necessity in the case of a donut-shaped annular dark field camera 32, for example; in such a camera, a central opening would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B", taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the particular context of gradient/iVF imaging, the following additional points deserve further elucidation:

The employed detector 32 (see FIG. 1) is embodied as a segmented detector, which, for example, may comprise a quadrant sensor, pixelated CMOS/CCD/SSPM detector, or PSD, for instance. Specific embodiments of such detectors are schematically shown in plan view in FIGS. 2A and 2B, and will be discussed below.

Figure 2A:
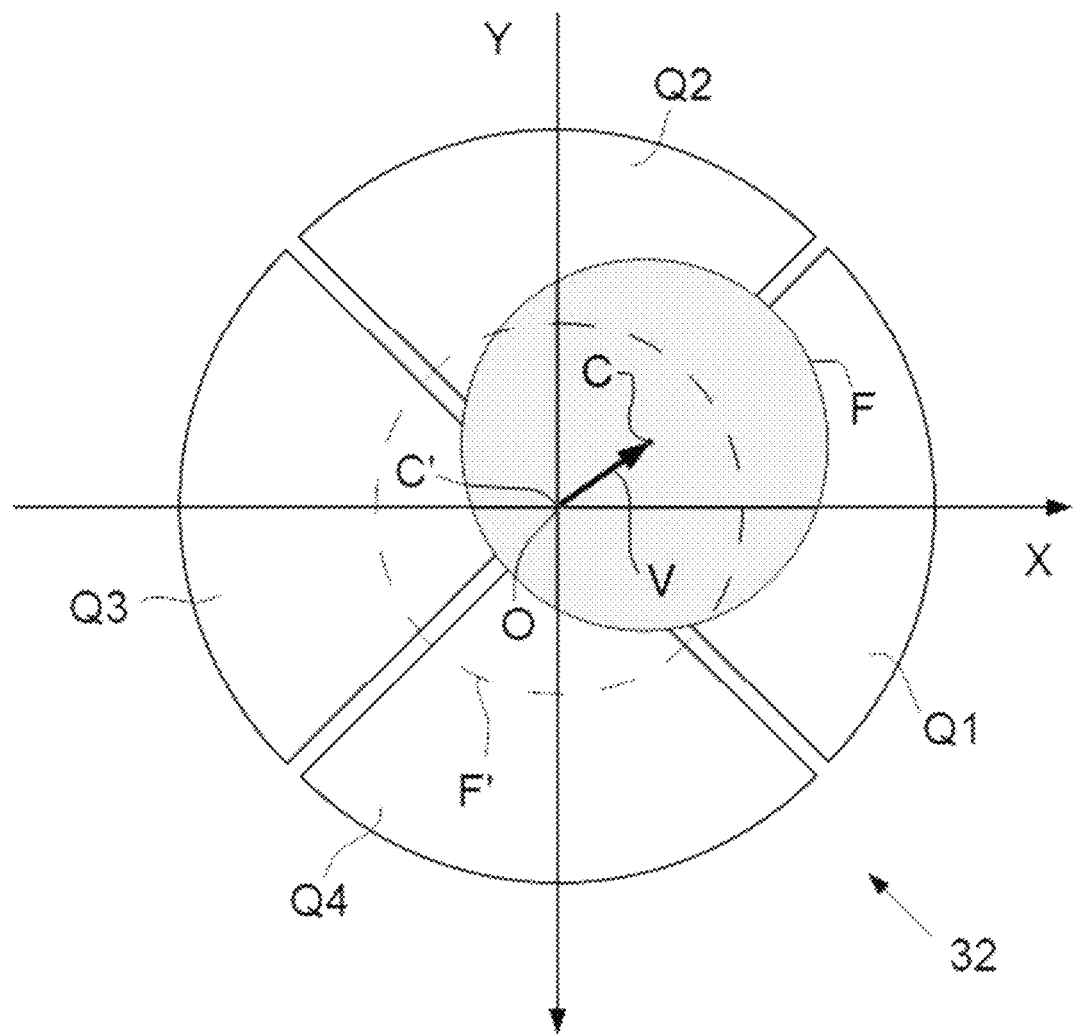
FIG. 2A depicts a plan view of a particular embodiment of a segmented detector (quadrant detector) that can be used in the subject of FIG. 1, in accordance with the current invention.

If a beam B propagating along particle-optical axis B" traverses the specimen S without undergoing any scattering/deflection in the specimen, then it will impinge (substantially) symmetrically on the center/origin O of the detector 32, and (essentially) give a "null" reading. This situation is shown in more detail in FIGS. 2A and 2B, which show coordinate axes X, Y with an origin at point O, on which is centered a dashed circle that schematically represents an impingement footprint F' of a (ghost) charged-particle beam B with barycenter C', such that:

In FIG. 2A, this footprint F' is symmetrically overlaid on detection quadrants (electrodes) Q1, Q2, Q3, Q4. If the detection signals (electrical currents) from these quadrants are respectively denoted by S1, S2, S3, S4, then this situation will yield zero difference signals S1-S3 and S2-S4 between opposing pairs of quadrants.

Figure 2B:
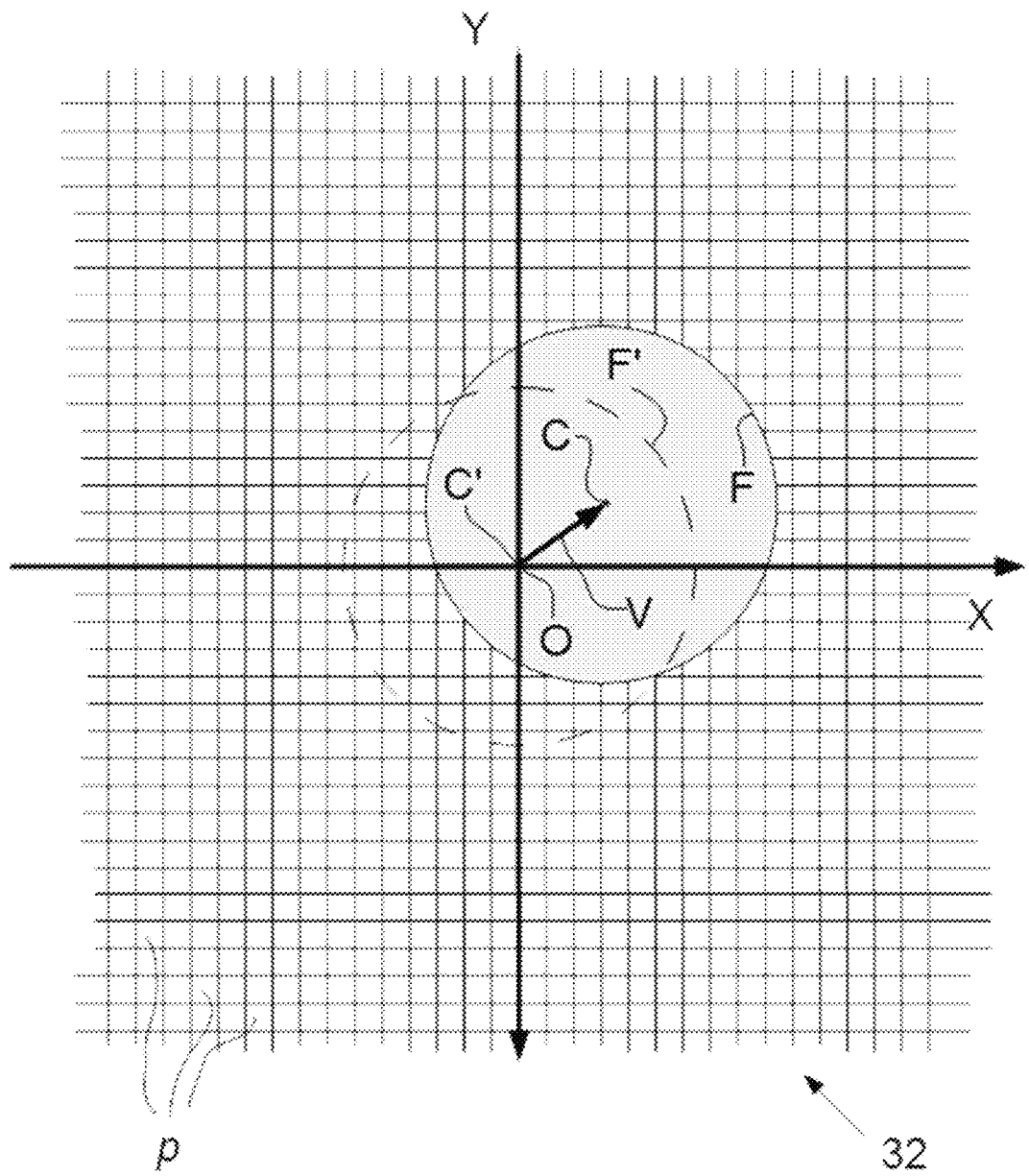
FIG. 2B depicts a plan view of another embodiment of a segmented detector (pixelated detector) that can be used in the subject of FIG. 1, in accordance with the current invention.

In FIG. 2B, which depicts an orthogonal matrix of detection pixels p (e.g. in a CMOS detector, possibly with an overlaid scintillation layer), there is zero deviation between the elected origin O of said pixel matrix and barycenter C'.

If, on the other hand, charged-particle beam B undergoes some scattering/deflection in the specimen S, it will land on the detector 32 at a position displaced from the origin O. In this context, FIGS. 2A and 2B show a beam footprint F with barycenter C that is no longer centered on O. The position of point C with respect to O defines a vector V, with an associated magnitude (length) and direction (pointing angle with respect to X axis, for example). This vector V can be expressed in terms of the coordinates ($X_c$, $Y_c$) of point C, which can be distilled as follows:

In FIG. 2A, one can derive (rudimentary) estimators for $X_c$, $Y_c$ using the following formulae:

$$X_C \sim \frac{S1-S3}{S1+S2+S3+S4}, Y_C \sim \frac{S2-S4}{S1+S2+S3+S4} \quad (1)$$

The term in the denominator can be (more correctly) replaced by the total charged particle dose at every pixel position; however, when absorption effects in the specimen are relatively insignificant (as for thin specimens, for example), this total dose will essentially be the same the denominator in equation (1) [or proportional to it, in the case of absorption that does not significantly vary on a pointwise basis].

In FIG. 2B, one can derive values for $X_c$, $Y_c$ by examining output signals from the various pixels p, because pixels p that are impinged upon by the beam footprint F will give a different output signal (electrical resistance, voltage or current, for example) to pixels p outside the footprint F. The location of C can then be directly deduced by noting the coordinates of that particular pixel that yields an extremal signal, or indirectly determined by mathematically calculating the barycenter of the cluster of pixels p impinged on by B, or via a hybrid technique that combines both approaches, for example. The skilled artisan will understand that the size of beam footprint F can be altered by adjusting the so-called "camera length" of the STCPM of FIG. 1, for example.

As beam B is scanned across the specimen S so as to trace out a two-dimensional scan path (area), the approach set forth in the previous item can be used to obtain a value of V for each coordinate position along said scan path. This allows compilation of a "map" of vector V as a function of scan position on the specimen S, which amounts to a mathematical field (and also a physical field, in that the vector V can be assigned a (proportional) physical meaning, such as electrostatic field vector).

The vector field resulting from the previous step can now be integrated two-dimensionally, so as to obtain an integrated vector field (iVF) image (which represents a map of electrostatic potential in specimen S).

More information on these (and related) aspects can be gleaned from the abovementioned U.S. Pat. No. 9,312,098, for example.

In the context of the present invention:
$X_c$, $Y_c$ can be regarded as being Dx, Dy, respectively;
Ds can, for example, be derived from the sum S1+S2+S3+S4 in FIG. 2A [see equation (1) above], or by summing the pixel values under footprint F in FIG. 2B. Such sums represent a BF value for Ds;
Alternatively/supplementally, an ADF (or HAADF) value for Ds could be obtained using an annular detector upstream of camera 32 (in the −Z direction) or outside/embracing the perimeter of camera 32 (essentially co-planar with it in the XY plane).

In accordance with the invention—and as will be explained in more detail below—the values of Dx, Dy and Ds at any given scan/sampling point $p_i$ can be used as a basis to classify a specimen composition at point $p_i$, allowing assignment to one of a number of different composition classes. This fact can be exploited in a two-tier scan strategy, whereby:
One first performs a relatively coarse pre-scan of the specimen S, along a pre-scan trajectory;
At selected positions $p_i$ on said pre-scan trajectory, one uses the values of Dx, Dy and Ds to classify the specimen composition at point $p_i$ into one of said composition classes;
For a selected composition class, one subsequently performs a relatively fine scan at positions $p_i$ assigned to that class.

These actions can be performed using a suitable configured controller/processor 20, for example—though, if desired, certain actions can also be performed/assisted manually by the microscope user.

EMBODIMENT 2

FIG. 3 shows a magnified photographic plan view of part of a vitrified specimen S. The illustration in FIG. 4 corresponds to a highly zoomed-in portion of the subject of FIG. 3. In both of these Figures, the specimen S comprises what is often referred to as a "grid" or "Autogrid". It typically comprises a circular ring of metallic wire (e.g. comprising Cu or Ni, for instance), the diameter of the ring typically being of the order of about 3 mm and the diameter of the wire typically being of the order of about 20-100 μm. Attached within the ring are straight wire portions 1, which are (in this case) arranged to form an orthogonal (planar) grid pattern, thus defining a matrix-like array of (substantially square) apertures (openings/apertures/windows) 1a. A thin membrane 3 has been spanned upon the grid (and, optionally, affixed to the wires 1, e.g. using an adhesive or by molten bonding). This membrane 3 may, for example, comprise a carbonaceous material such as nylon or graphene, and will typically have a thickness ranging from about 0.3 nm to hundreds of nm. The membrane 3 contains a distribution of holes (perforations/pores) 5, which typically have a diameter in a range of ca. 1.2-3.5 μm (e.g. ~2 μm). In essence, the grid acts as a scaffold for the membrane 3, and the membrane 3 in turn acts as a supporting structure for the holes 5 (so that it is sometimes referred to as a "holey carbon support"). A thin film of aqueous liquid (comprising one or more study objects/particles 9 (e.g. bacteria) suspended therein) is (ideally) spanned across each given hole 5, remaining in place (inter alia) by virtue of surface tension effects. It should be noted that structures as depicted in FIGS. 3 and 4 (grid+perforated membrane 3) and as described above are commercially available, e.g. from firms such as Ted Pella, Inc., of Redding, Calif., USA. It is also possible to purchase (a variety of) pre-manufactured holey carbon films (corresponding to the perforated membrane 3), e.g. from firms such as Quantifoil Micro Tools GmbH, Jena, Germany.

A specimen S such as that depicted in FIG. 3 can be vitrified by suddenly cooling it to cryogenic temperatures—a procedure which would ideally convert all the aqueous liquid in all the holes 5 into amorphous ice. However, as already mentioned above, such vitrification procedures seldom work perfectly, and often produce specimens S that are only partially usable. This phenomenon is schematically illustrated in detail in FIG. 4, which renders a zoomed-in view of part of FIG. 3. In particular, FIG. 4 shows that:
Certain holes 5' are devoid of aqueous liquid, and basically form an open/empty window.
Some of the aqueous liquid has been converted into amorphous ice 7, but there are also unwanted areas 7' of crystalline ice (in which, for example, needle-like ice crystals have damaged biological study objects 9).
The ice in some holes comprises unwanted (surface) contaminants 11.
Note that, in FIG. 3:
The white squares/cells 1a correspond to locations where membrane breakage/de-lamination has occurred (to a greater or lesser extent);
The dark/mottled grid squares/cells 1a are undamaged—or only somewhat damaged—by delamination.
In this particular photograph, it is seen that of the order of ca. 50% of the squares/cells 1a have suffered de-lamination damage.

To deal in an efficient and time-saving manner with such (and other, related) phenomena, the present invention uses a relatively coarse exploratory pre-scan to identify "fruitful" areas of the specimen S, followed by a more-detailed local scan of (one or more of) these fruitful areas. In this regard, FIG. 4 shows:

Scan lines 13, corresponding to a relatively coarse pre-scan of the specimen S. Such lines 13 can have a relatively large mutual separation (e.g. sampling points at a mutual spacing of ca. 1 μm) and/or a relatively short dwelling time per sampling point.

Scan lines 15, corresponding to a relatively fine subsequent scan of selected portions of the specimen S, identified during the pre-scan along lines 13. Such lines 13 will have a relatively small mutual separation (e.g. sampling points at a mutual spacing of ca. 5 nm) and/or a relatively long dwelling time per sampling point.

It should be noted that the relatively coarse scan lines 13 might be considered as being not coarse enough if one wants to scan an entire Autogrid (with a typical area of the order of ca. 10 mm$^2$); in that case, as alluded to above, one can perform an even coarser initial scan (e.g. with sampling points at a mutual spacing of ca. 100 μm), in order to get a general impression of the various different regions of the specimen in a relatively short time span. Similarly, once a study particle 9 of interest is identified, one can, if desired, examine it using an ultra-fine scan (e.g. with sampling points at a mutual spacing of ca. 0.1 nm), so as to investigate it with particularly high resolution.

FIG. 5 schematically illustrates how the detector signals Dx, Dy, Ds obtained during the coarse pre-scan along lines 13 can be employed as a basis to (automatically) identify different parts of the specimen S, whereby it is assumed in the current case that Ds is a BF signal (normed to a maximum value of 1), e.g. obtained from a detector set-up such as that shown in FIG. 2A or 2B. More specifically, the different sub-parts of FIG. 5 can be elucidated as follows:

(A) Copper (e.g. a portion of wire 1): This will typically give (apart from some low noise) essentially zero Dx, Dy responses and zero Ds response.

(B) Amorphous carbon (e.g. a portion of membrane 3): This will typically give purely random Dx, Dy responses, with essentially no periodicity. This is symbolically represented in the Figure by a uniform disk within which Dx, Dy values can be located. Ds will have an essentially constant, non-maximal value (k1).

(C) Crystalline ice (e.g. a portion of ice 7'): Typically shows a clear periodic pattern (e.g. a hexagonal unit cell) in the Dx, Dy responses. Ds will typically also demonstrate a periodic pattern, though this may be less pronounced than for Dx, Dy.

(D) Amorphous/vitreous ice (e.g. a portion of ice 7): Similar to amorphous carbon [see (B)], i.e. essentially random Dx, Dy responses, but typically with a smaller amplitude than amorphous carbon. Again, this is symbolically represented in the Figure by a uniform disk within which Dx, Dy values can be located, but of smaller diameter than the disk in (B). Ds will have an essentially constant, non-maximal value (k2).

(E) Hole without ice (e.g. a portion of hole 5'): Typically zero Dx, Dy responses and a relatively strong (essentially maximal) Ds response.

(F) Ice contamination (e.g. a portion of island 11): Typically gives chaotically scattered Dx, Dy responses, with a relatively low (essentially zero) Ds response.

(G) Particle/study object (e.g. a portion of entity 9): Here, as a scanning beam encounters a particle along its scan path, one typically observes sharp amplitude peaks in Dx, Dy at the start (x1)/end (x2) of the encounter with the particle, with typical irregularities in Dx, Dy response in between. The mini-graph shows a typical Dx response as a function of time t.

One can use signal analysis algorithms/firmware/software to automatically classify the material underlying a particular scanning point $p_i$ using such classification characteristics. For a typical vitrified specimen S such as that illustrated in FIG. 4, the skilled artisan will understand that:

Material categories such as (A), (B), (C), (E) and (F) are generally uninteresting. Scan path segments identified by the course pre-scan as falling within such categories can be typically ignored during a subsequent fine scan.

Material categories such as (D) and (G) are generally interesting. Scan path segments identified by the course pre-scan as falling within such categories can typically be made the focus of a subsequent fine scan.

The invention claimed is:

1. A method of imaging a specimen in a Scanning Transmission Charged Particle Microscope, the method comprising:
providing a beam of charged particles that is directed from a source through an illuminator so as to irradiate a specimen;
providing a segmented detector for detecting a flux of charged particles after having traversed the specimen; and
scanning said beam of charged particles across a surface of the specimen, and combining signals from different segments of the detector to produce a vector output from the detector at each scan position, said vector output having components Dx, Dy along respective X, Y coordinate axes,
wherein:
performing a relatively coarse pre-scan of the specimen, along a pre-scan trajectory;
at selected positions $p_i$ on said pre-scan trajectory, analyzing said components Dx, Dy and a scalar intensity sensor value Ds;
using said analysis of Dx, Dy and Ds to classify a specimen composition at each position $p_i$ into one of a group of composition classes; and
for a selected composition class, performing a relatively fine scan at positions $p_i$ assigned to that class.

2. A method according to claim 1, wherein:
said detector is embodied to comprise four quadrants; and
said components Dx, Dy are compiled by calculating difference signals between complementary pairs of quadrants respectively arranged along X and Y directions.

3. A method according to claim 1, wherein:
said detector is embodied as a pixelated detector comprising an array of pixels; and
said components Dx, Dy are compiled by:
comparing pixel values to determine a location for a barycenter of said flux on the detector; and
expressing X and Y coordinate positions of said barycenter on the detector.

4. A method according to claim 1, wherein said value Ds is a bright field value compiled by summing outputs from said segments of said detector.

5. A method according to claim 1, wherein said value Ds is an annular dark field value produced by an annular dark field sensor used in conjunction with said segmented detector.

6. A method according to claim 1, wherein said values of Dx, Dy are used to distinguish between amorphous and crystalline specimen composition at a given point $p_i$.

7. A method according to claim 1, wherein:
said specimen comprises a rigid grid that carries a membrane comprising a distribution of holes, at least some of which comprise a body of aqueous liquid; and
said composition classes comprise grid material, membrane material, vacant hole, vitrified ice in hole, crystalline ice in hole, surface-contaminated ice, study particle in ice, and combinations thereof.

8. A method according to claim 1, wherein;
in at least one prior calibration session, a library is compiled of Dx, Dy and Ds values corresponding to various composition classes; and
said classification step is performed by an algorithm that uses said library to elect a best-match composition class for the specimen at each said position $p_i$.

9. A method according to claim 1, wherein said relatively fine scan differs from said relatively coarse scan in respect of at least one of:
sampling point spatial separation; and
sampling point dwell time.

10. A method according to claim 1, wherein, in at least one of said pre-scan and fine scan:
said vector output per scan position is compiled to yield a vector field; and
said vector field is mathematically processed by subjecting it to a two-dimensional integration operation, thereby producing an integrated vector field image of the specimen.

11. A Scanning Transmission Charged Particle Microscope comprising:
an illuminator, for directing a beam of charged particles from a source toward a specimen;
segmented detector, for detecting a flux of charged particles traversing the specimen; and
a controller configured to:
scan said beam of charged particles across a surface of the specimen; and
combine signals from different segments of said detector so as to produce a vector output from the detector at each scan position, said vector output having components Dx, Dy along respective X, Y coordinate axes,
wherein said controller is further configured to:
perform a relatively coarse pre-scan of the specimen, along a pre-scan trajectory;
at selected positions $p_i$ along said pre-scan trajectory, analyze said components Dx, Dy and a scalar intensity sensor value Ds;
use said analysis of Dx, Dy and Ds to classify a specimen composition at each position pi into one of a group of composition classes; and
for a selected composition class, perform a relatively fine scan at positions pi assigned to that class.

12. A microscope according to claim 11, wherein:
a memory is configured to store measurement results compiled from at least one prior calibration session, comprising a library of Dx, Dy and Ds values corresponding to various composition classes; and
said controller is configured to use said library to elect a best-match composition class for the specimen at each said position $p_i$.

* * * * *